United States Patent
Samoilov

(10) Patent No.: US 8,492,284 B2
(45) Date of Patent: *Jul. 23, 2013

(54) LOW TEMPERATURE ETCHANT FOR TREATMENT OF SILICON-CONTAINING SURFACES

(75) Inventor: Arkadii Samoilov, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/305,235

(22) Filed: Nov. 28, 2011

(65) Prior Publication Data

US 2012/0070961 A1     Mar. 22, 2012

Related U.S. Application Data

(63) Continuation of application No. 11/752,477, filed on May 23, 2007, now abandoned, which is a continuation of application No. 11/047,323, filed on Jan. 31, 2005, now Pat. No. 7,235,492.

(51) Int. Cl.
  *H01L 21/302* (2006.01)
  *H01L 21/461* (2006.01)

(52) U.S. Cl.
  USPC ............................ 438/706; 438/714; 438/719

(58) Field of Classification Search
  None
  See application file for complete search history.

(56) References Cited

U.S. PATENT DOCUMENTS

| | | | |
|---|---|---|---|
| 4,663,831 A | 5/1987 | Birrittella et al. | |
| 4,834,831 A | 5/1989 | Nishizawa et al. | |
| 5,028,560 A | 7/1991 | Tsukamoto et al. | |
| 5,112,439 A | 5/1992 | Reisman et al. | |
| 5,129,958 A | 7/1992 | Nagashima et al. | |
| 5,273,930 A | 12/1993 | Steele et al. | |
| 5,288,658 A | 2/1994 | Ishihara et al. | |
| 5,294,286 A | 3/1994 | Nishizawa et al. | |
| 5,308,788 A | 5/1994 | Fitch et al. | |
| 5,372,860 A | 12/1994 | Fehlner et al. | |
| 5,374,570 A | 12/1994 | Nasu et al. | |

(Continued)

FOREIGN PATENT DOCUMENTS

| | | |
|---|---|---|
| EP | 1150345 | 10/2001 |
| GB | 2355727 | 5/2001 |

(Continued)

OTHER PUBLICATIONS

U.S. Appl. No. 11/242,613, filed Oct. 3, 2005.

(Continued)

*Primary Examiner* — Duy Deo
(74) *Attorney, Agent, or Firm* — Patterson & Sheridan, LLP

(57) ABSTRACT

Embodiments provide methods for etching and depositing silicon materials on a substrate. In one example, the method includes heating a substrate containing a silicon-containing material to a temperature of about 800° C. or less and removing a portion of the silicon-containing material and a contaminant to reveal an exposed surface of the silicon-containing material during an etching process and depositing a silicon-containing layer on the exposed surface of the silicon-containing material during a deposition process. The method further provides conducting the etching and deposition processes in the same chamber and utilizing chlorine gas and a silicon source gas during the etching and deposition processes. In some examples, the silicon-containing material is removed at a rate within a range from about 2 Å per minute to about 20 Å per minute during the etching process.

18 Claims, 5 Drawing Sheets

U.S. PATENT DOCUMENTS

| | | |
|---|---|---|
| 5,469,806 A | 11/1995 | Mochizuki et al. |
| 5,480,818 A | 1/1996 | Matsumoto et al. |
| 5,503,875 A | 4/1996 | Imai et al. |
| 5,521,126 A | 5/1996 | Okamura et al. |
| 5,527,733 A | 6/1996 | Nishizawa et al. |
| 5,674,304 A | 10/1997 | Fukada et al. |
| 5,693,139 A | 12/1997 | Nishizawa et al. |
| 5,716,495 A | 2/1998 | Butterbaugh et al. |
| 5,796,116 A | 8/1998 | Nakata et al. |
| 5,807,792 A | 9/1998 | Ilg et al. |
| 5,906,680 A | 5/1999 | Meyerson |
| 5,908,307 A | 6/1999 | Talwar et al. |
| 5,916,365 A | 6/1999 | Sherman |
| 5,983,906 A | 11/1999 | Zhao et al. |
| 6,025,627 A | 2/2000 | Forbes et al. |
| 6,042,654 A | 3/2000 | Comita et al. |
| 6,124,158 A | 9/2000 | Dautartas et al. |
| 6,144,060 A | 11/2000 | Park et al. |
| 6,159,852 A | 12/2000 | Nuttall et al. |
| 6,159,862 A | 12/2000 | Yamada et al. |
| 6,200,893 B1 | 3/2001 | Sneh |
| 6,207,487 B1 | 3/2001 | Kim et al. |
| 6,232,196 B1 | 5/2001 | Raaijmakers et al. |
| 6,270,572 B1 | 8/2001 | Kim et al. |
| 6,284,646 B1 | 9/2001 | Leem |
| 6,284,686 B1 | 9/2001 | Marlor |
| 6,287,965 B1 | 9/2001 | Kang et al. |
| 6,291,319 B1 | 9/2001 | Yu et al. |
| 6,303,476 B1 | 10/2001 | Hawryluk et al. |
| 6,305,314 B1 | 10/2001 | Sneh et al. |
| 6,335,280 B1 | 1/2002 | van der Jeugd |
| 6,342,277 B1 | 1/2002 | Sherman |
| 6,342,421 B1 | 1/2002 | Mitani et al. |
| 6,348,420 B1 | 2/2002 | Raaijmakers et al. |
| 6,352,945 B1 | 3/2002 | Matsuki et al. |
| 6,358,829 B2 | 3/2002 | Yoon et al. |
| 6,383,955 B1 | 5/2002 | Matsuki et al. |
| 6,383,956 B2 | 5/2002 | Hawryluk et al. |
| 6,387,761 B1 | 5/2002 | Shih et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,410,463 B1 | 6/2002 | Matsuki et al. |
| 6,451,119 B2 | 9/2002 | Sneh et al. |
| 6,458,718 B1 | 10/2002 | Todd |
| 6,462,367 B2 | 10/2002 | Marsh et al. |
| 6,468,924 B2 | 10/2002 | Lee et al. |
| 6,489,241 B1 | 12/2002 | Thilderkvist et al. |
| 6,492,283 B2 | 12/2002 | Raaijmakers et al. |
| 6,511,539 B1 | 1/2003 | Raaijmakers |
| 6,534,395 B2 | 3/2003 | Werkhoven et al. |
| 6,544,900 B2 | 4/2003 | Raaijmakers et al. |
| 6,559,520 B2 | 5/2003 | Matsuki et al. |
| 6,562,720 B2 | 5/2003 | Thilderkvist et al. |
| 6,580,104 B1 | 6/2003 | U'Ren |
| 6,620,670 B2 | 9/2003 | Song et al. |
| 6,630,413 B2 | 10/2003 | Todd |
| 6,632,279 B1 | 10/2003 | Ritala et al. |
| 6,635,588 B1 | 10/2003 | Hawryluk et al. |
| 6,645,838 B1 | 11/2003 | Talwar et al. |
| 6,797,558 B2 | 9/2004 | Nuttall et al. |
| 6,821,825 B2 | 11/2004 | Todd et al. |
| 6,969,668 B1 | 11/2005 | Kang et al. |
| 7,235,492 B2 * | 6/2007 | Samoilov ............... 438/714 |
| 8,093,154 B2 * | 1/2012 | Zojaji et al. ............ 438/706 |
| 2001/0000866 A1 | 5/2001 | Sneh et al. |
| 2001/0020712 A1 | 9/2001 | Raaijmakers et al. |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0046567 A1 | 11/2001 | Matsuki et al. |
| 2001/0054381 A1 | 12/2001 | Umotoy et al. |
| 2001/0055672 A1 | 12/2001 | Todd |
| 2002/0000598 A1 | 1/2002 | Kang et al. |
| 2002/0016084 A1 | 2/2002 | Todd |
| 2002/0019148 A1 | 2/2002 | Hawryluk et al. |
| 2002/0022294 A1 | 2/2002 | Hawryluk et al. |
| 2002/0031618 A1 | 3/2002 | Sherman |
| 2002/0047151 A1 | 4/2002 | Kim et al. |
| 2002/0060363 A1 | 5/2002 | Xi et al. |
| 2002/0074588 A1 | 6/2002 | Lee |
| 2002/0076837 A1 | 6/2002 | Hujanen et al. |
| 2002/0090818 A1 | 7/2002 | Thilderkvist et al. |
| 2002/0093042 A1 | 7/2002 | Oh et al. |
| 2002/0098627 A1 | 7/2002 | Pomarede et al. |
| 2002/0117399 A1 | 8/2002 | Chen et al. |
| 2002/0145168 A1 | 10/2002 | Bojarczuk et al. |
| 2002/0155722 A1 | 10/2002 | Satta et al. |
| 2002/0168868 A1 | 11/2002 | Todd |
| 2002/0172768 A1 | 11/2002 | Endo et al. |
| 2002/0173113 A1 | 11/2002 | Todd |
| 2002/0173130 A1 | 11/2002 | Pomerede et al. |
| 2002/0197831 A1 | 12/2002 | Todd et al. |
| 2002/0197881 A1 | 12/2002 | Ramdani et al. |
| 2003/0013320 A1 | 1/2003 | Kim et al. |
| 2003/0015764 A1 | 1/2003 | Raaijmakers et al. |
| 2003/0022528 A1 | 1/2003 | Todd |
| 2003/0032281 A1 | 2/2003 | Werkhoven et al. |
| 2003/0036268 A1 | 2/2003 | Brabant et al. |
| 2003/0045074 A1 | 3/2003 | Seibel et al. |
| 2003/0049942 A1 | 3/2003 | Haukka et al. |
| 2003/0060057 A1 | 3/2003 | Raaijmakers et al. |
| 2003/0062335 A1 | 4/2003 | Brewer |
| 2003/0072884 A1 | 4/2003 | Zhang et al. |
| 2003/0072975 A1 | 4/2003 | Shero et al. |
| 2003/0082300 A1 | 5/2003 | Todd et al. |
| 2003/0089308 A1 | 5/2003 | Raaijmakers |
| 2003/0089942 A1 | 5/2003 | Bhattacharyya |
| 2003/0101927 A1 | 6/2003 | Raaijmakers |
| 2003/0106490 A1 | 6/2003 | Jallepally et al. |
| 2003/0108674 A1 | 6/2003 | Chung et al. |
| 2003/0116804 A1 | 6/2003 | Visokay et al. |
| 2003/0124262 A1 | 7/2003 | Chen et al. |
| 2003/0129826 A1 | 7/2003 | Werkhoven et al. |
| 2003/0143841 A1 | 7/2003 | Yang et al. |
| 2003/0160277 A1 | 8/2003 | Bhattacharyya |
| 2003/0166318 A1 | 9/2003 | Zheng et al. |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186561 A1 | 10/2003 | Law et al. |
| 2003/0188682 A1 | 10/2003 | Tois et al. |
| 2003/0189208 A1 | 10/2003 | Law et al. |
| 2003/0189232 A1 | 10/2003 | Law et al. |
| 2003/0190423 A1 | 10/2003 | Yang et al. |
| 2003/0190497 A1 | 10/2003 | Yang et al. |
| 2003/0194853 A1 | 10/2003 | Jeon |
| 2003/0198754 A1 | 10/2003 | Xi et al. |
| 2003/0213560 A1 | 11/2003 | Wang et al. |
| 2003/0215570 A1 | 11/2003 | Seutter et al. |
| 2003/0216981 A1 | 11/2003 | Tillman |
| 2003/0232554 A1 | 12/2003 | Blum et al. |
| 2003/0235961 A1 | 12/2003 | Metzner et al. |
| 2004/0007747 A1 | 1/2004 | Visokay et al. |
| 2004/0009307 A1 | 1/2004 | Koh et al. |
| 2004/0009675 A1 | 1/2004 | Eissa et al. |
| 2004/0016973 A1 | 1/2004 | Rotondaro et al. |
| 2004/0023462 A1 | 2/2004 | Rotondaro et al. |
| 2004/0033674 A1 | 2/2004 | Todd |
| 2004/0033698 A1 | 2/2004 | Lee et al. |
| 2004/0043149 A1 | 3/2004 | Gordon et al. |
| 2004/0043569 A1 | 3/2004 | Ahn et al. |
| 2004/0053484 A1 | 3/2004 | Kumar et al. |
| 2004/0053515 A1 | 3/2004 | Comita et al. |
| 2004/0175893 A1 | 9/2004 | Vatus et al. |
| 2004/0226911 A1 | 11/2004 | Dutton et al. |
| 2004/0253776 A1 | 12/2004 | Hoffmann et al. |
| 2005/0079691 A1 | 4/2005 | Kim et al. |
| 2006/0169669 A1 | 8/2006 | Zojaji et al. |

FOREIGN PATENT DOCUMENTS

| | | |
|---|---|---|
| JP | 58098917 | 6/1983 |
| JP | 62171999 A | 7/1987 |
| JP | 63062313 | 3/1988 |
| JP | 01143221 | 6/1989 |

| | | |
|---|---|---|
| JP | 01270593 | 10/1989 |
| JP | 02172895 | 7/1990 |
| JP | 03286522 | 12/1991 |
| JP | 05047665 | 2/1993 |
| JP | 05102189 | 4/1993 |
| JP | 05251339 | 9/1993 |
| JP | 06196809 | 7/1994 |
| JP | 7300649 | 11/1995 |
| JP | 2001111000 | 4/2001 |
| JP | 2001172767 | 6/2001 |
| JP | 2001189312 | 7/2001 |
| WO | WO-9820524 | 5/1998 |
| WO | WO-0016377 | 3/2000 |
| WO | WO-0054320 | 9/2000 |
| WO | WO-0115220 A1 | 3/2001 |
| WO | WO-0117692 A1 | 3/2001 |
| WO | WO-0129893 A1 | 4/2001 |
| WO | WO-0140541 A1 | 6/2001 |
| WO | WO-0141544 | 6/2001 |
| WO | WO-0166832 A2 | 9/2001 |
| WO | WO-0243115 | 5/2002 |
| WO | WO-0245167 | 6/2002 |
| WO | WO-02064853 | 8/2002 |
| WO | WO-02065508 | 8/2002 |
| WO | WO-02065516 | 8/2002 |
| WO | WO-02065517 | 8/2002 |
| WO | WO-02065525 | 8/2002 |
| WO | WO-02080244 | 10/2002 |
| WO | WO-02097864 | 12/2002 |

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001) pp. K2.1.1-K2.1.11.

Bedair, S.M. "Atomic Layer Epitaxy Deposition Processes," J. Vac. Sci. Technol. B., vol. 12, No. 1, Jan./Feb. 1994.

Choi, et al. "Stability of $TiB_2$ as a Diffusion Barrier on Silicon," J. Electrochem. Soc., vol. 138, No. 10, Oct. 1991.

Choi, et al. "The Effect of Annealing on Resistivity of Low Pressure Chemical Vapor Deposited Titanium Diboride," J. Appl. Phys. 69(11), Jun. 1, 1991.

Derbyshire, K. "Applications of Integrated Processing," Solid State Technology, Dec. 1994 pp. 45-48.

Debusschere, et al. "Importance of determining the polysilicon dopant profile during process development," J. Vac. Sci. Technol. B 14(1), Jan./Feb. 1996.

Earles, et al. "Nonmelt Laser Annealing of 5-KeV and 1-KeV Boron-Implanted Silicon," IEEE Transactions on Electron Devices, vol. 49, No. 7, Jul. 2002.

Elers, et al. "$NbCl_5$ as a Precursor in Atomic Layer Epitaxy," Applied Surface Science 82/83 (1994) pp. 468-474.

George, et al. "Surface Chemistry for Atomic Layer Growth," J. Phys. Chem. 1996, 100, pp. 13121-13131.

Hwang, et al. "Nanometer-Size $\alpha$-$PbO_2$-Type $TiO_2$ in Garnet: A Thermobarometer for Ultrahigh-Pressure Metamorphism," Science Vo. 288 (Apr. 14, 2000) pp. 321-324.

International Search Report mailed Feb. 22, 2005 for PCT/US2004/030872.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000, pp. 1395-1399.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001, pp. 285-289.

Kamins, et al. "Kinetics of selective epitaxial deposition of $Si_{1-x}Ge_x$", Applied Physics Letters, American Institute pf Physics. New York, US, vol. 61, No. 6, Aug. 10, 1992, pp. 669-671.

Kenichi, Ishi, et al., "Low Temperature Pretreatment in Chemical Vapor Deposition of a Silicon Film for Solid-Phase Epitaxial Growth", Japanese Journal of Applied Physics, vol. 27, No. 10, Oct. 1, 1988, pp. L1983-L1985.

Lee, et al. "Cyclic Techique for the Enhancement of Highly Oriented Diamond Film Growth," Thin Solid Films 303 (1997) pp. 264-269.

Menon, et al. "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Min, et al. "Chemical Vapor Deposition of Ti—Si—N Films with Alternating Source Supply," Mat. Res. Soc. Symp. Proc. vol. 564 (1999) pp. 207-210.

Min, et al. "Metal-organic Atomic-layer Deposition of Titanium—silicon—nitride Films," Applied Physics Letters, vol. 75, No. 11 (Sep. 11, 1999) pp. 1521-1523.

Paranjpe, et al. "Atomioc Layer Deposition of $AlO_x$ for Thin Film Head Gap Applications," J. Electrochem. Soc., vol. 148, No. 9, Sep. 2001 pp. G465-G471.

Ritala, et al. "Atomic Layer Deposition of Oxide Thin Films with Metal Alkoxides as Oxygen Sources," Science vol. 288 Apr. 14, 2000, pp. 319-321.

Sedgwick, et al. "Selective SiGe and heavily as doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Talwar, et al. "Junction sealing unsing lasers for thermal annealing," Solid State Technology, vol. 46, Issue 7, Jul. 2003.

Uchino, et al. "A Raised Source/Drain Technology Using In-situ P-doped SiGe and B-doped Si for 0.1 .mu.m CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Yamshita, et al. "Kinetics of Boron Activation by Flash Lamp Annealing," Extend Abstracts of the 2003 International Conference of Solid State Devices and Materials, Tokyo, 2003, pp. 742-743.

Extended European Search Report for EP 06 71 9626, dated Mar. 10, 2008, copy consist of 10 pages.

Extended European Search Report dated Feb. 12, 2010 for European Application No. 08169059.6.

Extended European Search Report dated Feb. 12, 2010 for European Application No. 08169060.4.

Wolf et al., "Silicon Processing for the VLSI Era," vol. 1, 1986, p. 542-558.

Official Letter dated Sep. 25, 2009 from Chinese Patent Office for corresponding Chinese Patent application 200680010817.0.

* cited by examiner

LOW TEMPERATURE ETCHANT FOR TREATMENT OF SILICON-CONTAINING SURFACES

CROSS-REFERENCE TO RELATED APPLICATION

This application is a continuation of U.S. Ser. No. 11/752,477, filed May 23, 2007, which is a continuation of U.S. Ser. No. 11/047,323, filed Jan. 31, 2005, now issued as U.S. Pat. No. 7,235,492, which are herein incorporated by reference in their entirety.

BACKGROUND OF THE INVENTION

1. Field of the Invention

Embodiments of the invention generally relate to the field of electronic manufacturing processes and devices, more particular, to methods of etching and depositing silicon-containing materials while forming electronic devices.

2. Description of the Related Art

Electronic devices such as semiconductor devices are fabricated by an assortment of steps including the deposition and removal of silicon-containing material. These deposition and removal steps as well as other process steps can cause the substrate surface containing a silicon-containing material to become rough and/or bare contaminant. Rough or contaminated substrate surfaces generally lead to poor quality interfaces which provide poor device performance and reliability.

Etching processes have been developed to combat contamination and roughness on substrate surfaces. However, these traditional etching processes have some draw backs. Usually, etchants, such as hydrogen chloride (HCl), require a high activation temperature in order to remove silicon-containing materials. Therefore, etching processes are often conducted at temperatures of 1,000° C. or higher. Such high temperatures are not desirable during a fabrication process due to thermal budget considerations, possible uncontrolled nitridation reactions to the substrate surface and loss of economically efficiencies. Chlorine ($Cl_2$) has been used to remove silicon-containing materials during etch processes at lower temperatures than processes that utilize hydrogen chloride etchants. However, chlorine reacts very quickly with silicon-containing materials and thus the etch rate is not easily controlled. Therefore, silicon-containing materials are usually over etched by processes using chlorine gas.

Also, traditional etching processes generally are conducted in an etching chamber or a thermal processing chamber. Once the etching of the silicon-containing material is complete, the substrate is transferred into a secondary chamber to for a subsequent deposition process. Often, the substrate is exposed to the ambient environment between the etching process and the deposition process. The ambient environment may introduce the substrate surface to water and/or oxygen and form an oxide layer.

Even before the etching processor depositing process is conducted, substrates are usually exposed to a pre-treatment process that may include a wet clean process, such as a HF-last process, a plasma clean or an acid wash process. After a pre-treatment process and prior to starting an etching process, the substrate may have to reside outside the process chamber or controlled environment for a period of time called the queue time (Q-time). During the Q-time, the substrate is exposed to ambient environmental conditions that include an oxygen and water at atmospheric pressure and room temperature. The ambient exposure forms an oxide layer on the substrate surface, such as silicon oxide. Generally, longer Q-times form thicker oxide layers and therefore more extreme etching processes must be conducted at higher temperatures and pressures.

Therefore, there is a need to have an etching process for treating a silicon-containing material on a substrate surface to remove any surface contaminants contained thereon and/or to smooth the substrate surface. There is also a need to be able to treat the substrate surface in a process chamber which could subsequently be used during the next process step, such as to deposit an epitaxy layer. Furthermore, there is a need to maintain the process temperature at a low temperature, such as below 1,000° C., and preferably below 800° C., even on substrates that have endured long Q-times (e.g., about 10 hours).

SUMMARY OF THE INVENTION

In one embodiment of the invention, a method of etching a silicon-containing material on a substrate surface is provided which includes positioning a substrate containing a contaminant into a process chamber, exposing the substrate surface to an etching gas that contains chlorine gas, a silicon source and a carrier gas and removing a first layer of the substrate surface and the contaminant. In one example, the process may remove the first layer at a rate in a range from about 2 Å per minute to about 20 Å per minute. In another example, the carrier gas is nitrogen, the silicon source is silane and the process chamber is maintained at a temperature in a range from about 500° C. to about 700° C.

In another embodiment of the invention, a method of smoothing a silicon-containing material on a substrate surface is provided which includes positioning a substrate into a process chamber, wherein the substrate contains a silicon-containing material with a first surface roughness of about 1 nm RMS or greater, exposing the silicon-containing material to an etching gas that contains an etchant, a silicon source and a carrier gas and redistributing the silicon-containing material to form a second surface roughness of less than about 1 nm RMS. In one example, the carrier gas is nitrogen, the silicon source is silane and the etchant is chlorine gas.

In another embodiment of the invention, a method of etching a silicon-containing material on a substrate that contains a monocrystalline surface and at least a second material selected from a nitride surface, an oxide surface or combinations thereof is provided which includes positioning the substrate into a process chamber and exposing the substrate surface to an etching gas that contains chlorine gas and a carrier gas. The method further includes removing a first layer of the monocrystalline surface to form an exposed monocrystalline surface and depositing an epitaxy layer on the exposed monocrystalline surface in the same process chamber as used during the removing step. In one example, the etching gas also contains a silicon source.

In another embodiment of the invention, a method of forming a silicon-containing monocrystalline material on a substrate is provided which includes exposing a substrate to a HF-last wet clean process, positioning the substrate into a process chamber and exposing the substrate to an etching gas containing chlorine gas and a carrier gas. A predetermined thickness of the silicon-containing monocrystalline material is removed to form an exposed monocrystalline surface. The method further includes depositing an epitaxy layer on the exposed monocrystalline surface in the process chamber and subsequently cleaning the process chamber with the chlorine gas to remove silicon-containing contaminant adhered thereon.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
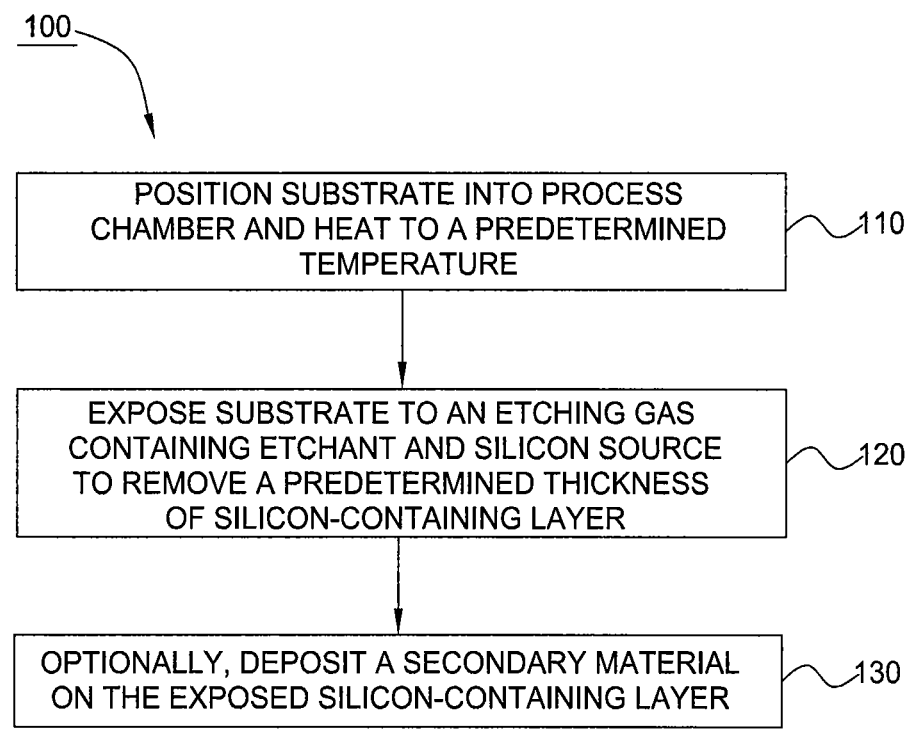
FIG. 1 is a flow chart describing a process to treat silicon-containing materials in one embodiment described herein.

Embodiments of the invention disclose processes to etch and deposit silicon-containing materials on substrate surfaces. The etching processes include a slow etch process (e.g., <100 Å/min) that utilizes an etching gas that contains an etchant and a silicon source as well as a fast etch process (e.g., >100 Å/min).

In one embodiment of the invention, a method for finishing or treating a silicon-containing surface is provided which includes smoothing the surface and/or removing contaminants contained on the surface. According to one example, a substrate having a silicon-containing surface is placed into a process chamber and heated to a temperature in a range from about 500° C. to about 700° C. While the substrate is heated, the silicon-containing surface is exposed to an etching gas that contains an etchant, a silicon source and a carrier gas. An etchant, such as chlorine gas ($Cl_2$) may be selected so that a relatively low temperature is used during the etching process. A silicon source is provided simultaneously with the etchant in order to counter act any over etching caused by the etchant. That is, the silicon source is used to deposit silicon on the silicon-containing layer while the etchant removes the silicon. The rates at which the etchant and the silicon source are introduced to the substrate are adjusted so that the overall reaction favors material removal and/or redistribution. Therefore, in one example, the overall reaction removes silicon-containing material while the etch rate is finely controlled to several angstroms or less per minute. During an example of a process to redistribute silicon-containing material, the surface is smoothed as material is removed from higher portions of the surface (i.e., peaks) while material is added to the lower portions of the surface (i.e., troughs). Embodiments of the invention can transform a silicon-containing surface with a surface roughness of about 6 nm root mean square (RMS) or more into a much smoother surface with a surface roughness of less than about 0.1 nm RMS.

In another embodiment of the invention, a method for etching a silicon-containing surface is provided which includes removing silicon-containing material at a fast rate in order to form a recess in a source/drain (S/D) area on the substrate. According to one example of the fast etch process, a substrate having a silicon-containing surface is placed into a process chamber and heated to a temperature in a range from about 500° C. to about 700° C. While the substrate is heated, the silicon-containing surface is exposed to an etching gas that contains an etchant and a carrier gas. The etchant, such as chlorine gas, may be selected so that a relatively low temperature is used during the etching process while maintaining a fast etch rate. A silicon source may be added to the etching gas to have more control of the removal rate.

Slow Etch (Pre-Clean and Smooth)

In one embodiment, a slow etch process (e.g., <100 Å/min) is conducted to remove contaminants and/or surface irregularities, such as roughness, from a substrate surface. The substrate surface is etched to expose an underlayer free of the contaminants and/or material of the substrate surface is redistributed to minimize peaks and troughs that attribute to surface irregularities. During the slow etch process, the substrate is exposed to an etching gas containing an etchant, a silicon source and a carrier gas. The overall reaction is controlled in part by the relative flow rates of the etchant and the silicon source, the specific etchant and silicon source, and the temperature and the pressure that the process is conducted.

Prior to starting an etching process, a substrate may be exposed to a pre-treatment process to prepare the surface for the subsequent etching. A pre-treatment process may include a wet clean process, such as a HF-last process, a plasma clean, an acid wash process and combinations thereof. In one example, the substrate is treated to a HF-last wet clean process by exposing the surface to a hydrofluoric acid solution for about 2 minutes.

Figure 2A:
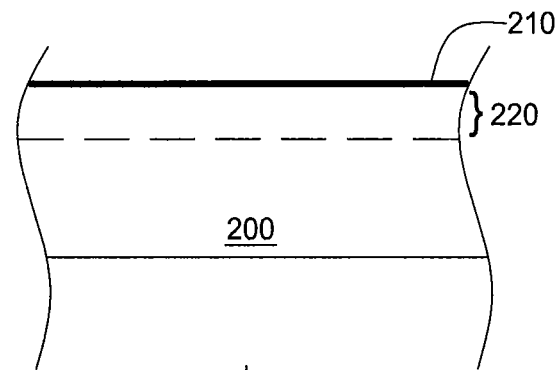
FIGS. 2A-2C show schematic illustrations of layers treated by processes described in FIG. 1.
Figure 2A:
Figure 2B:
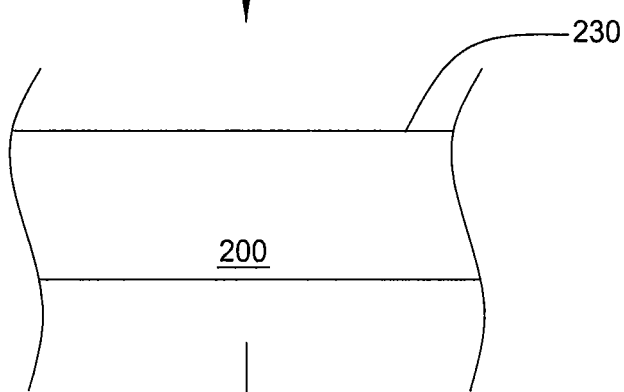
Figure 2B:
Figure 2C:
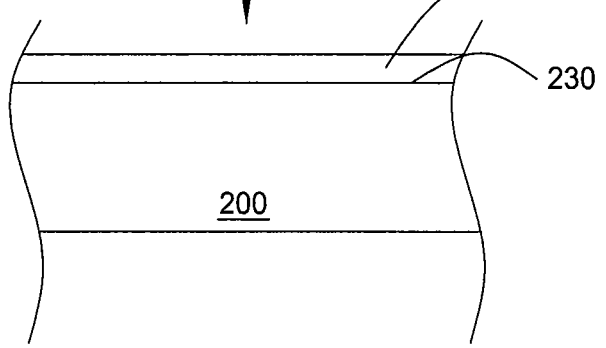

FIG. 1 depicts process 100 conducted to remove contaminants and/or rough areas on substrate 200, as depicted in FIGS. 2A-2C. In FIG. 2A, substrate 200 contains contaminants and/or rough areas on surface 210. A pre-determined thickness 220 of the substrate 200 including surface 210 is removed during the etching process to reveal exposed surface 230. A layer 240 is optionally deposited on exposed surface 230. Usually, layer 240 is a silicon-containing material deposited by an epitaxy deposition process.

Embodiments of the processes described herein etch and deposit silicon-containing materials on various substrates surfaces and substrates. A "substrate" or "substrate surface" as used herein refers to any substrate or material surface formed on a substrate upon which film processing is performed. For example, a substrate surface on which processing may be performed include materials such as silicon, silicon-containing materials, silicon oxide, strained silicon, silicon on insulator (SOI), carbon doped silicon oxides, silicon nitride, doped silicon, silicon germanium, silicon germanium carbon, germanium, gallium arsenide, glass, sapphire, and other materials depending on the application. A substrate surface may also include dielectric materials such as silicon dioxide, silicon nitride, silicon oxynitride, and/or carbon doped silicon oxides. Substrates may have various dimensions, such as 200 mm or 300 mm diameter round wafers, as well as, rectangular or square panes. Embodiments of the processes described herein etch and deposit on many substrates and surfaces, especially, silicon and silicon-containing materials. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers silicon nitride and patterned or non-patterned wafers.

Throughout the application, the terms "silicon-containing" materials, compounds, films or layers should be construed to include a composition containing at least silicon and may contain germanium, carbon, boron, arsenic, phosphorous, gallium, and/or aluminum. Other elements, such as metals, halogens or hydrogen may be incorporated within a silicon-containing material, compound, film or layer, usually in part per million (ppm) concentrations. Compounds or alloys of silicon-containing materials may be represented by an abbreviation, such as Si for silicon, SiGe, for silicon germanium, SiC for silicon carbon, and SiGeC for silicon germanium carbon. The abbreviations do not represent chemical equations with stoichiometrical relationships, nor represent any particular reduction/oxidation state of the silicon-containing materials. Silicon-containing materials, compounds, films, or layers may include substrates or substrate surfaces.

Contaminants left on the surface 210 from a previous process may include organic residues, carbon, oxides, nitrides, halides (e.g., fluorides or chlorides) and combinations thereof. For example, surface 210 may contain a layer of silicon oxide after being exposed to the ambient air or may contain a layer of silicon fluoride after being treated with a HF-last wet clean process. Surface 210 may also contain irregularities, such as regional areas of roughness that include troughs and peaks.

During step 110, substrate 200 is positioned into a process chamber and heated to a predetermined temperature. The substrate and/or the process chamber is maintained at temperature in a range from about 400° C. to about 800° C., preferably from about 500° C. to about 700° C. The process chamber is maintained at a pressure in a range from about 0.1 Torr to about 750 Torr, preferably, from about 1 Torr to about 100 Torr, and more preferably, from about 10 Torr to about 40 Torr.

The etching gas used during the slow etch process in step 120 contains an etchant, a silicon source and a carrier gas. Preferably, the etchant is chlorine gas ($Cl_2$). In one example, it has been found that chlorine works exceptionally well as an etchant for silicon-containing materials at temperatures lower than processes using more common etchants. Therefore, an etching process utilizing chlorine may be conducted at a lower process temperature. The silicon source is provided simultaneously with the etchant in order to counter act any over etching of the substrate 200. The silicon source is used to deposit silicon on the silicon-containing layer while the etchant removes the silicon-containing material. The rates at which the etchant and the silicon source are introduced to the substrate are adjusted so that the overall reaction favors material removal and/or material redistribution. Therefore, the overall reaction is removing or redistributing silicon-containing material and the etch rate may be finely controlled to several angstroms per minute.

The etchant is provided into the process chamber in the etching gas at a rate in a range from about 1 standard cubic centimeters per minute (sccm) to about 100 sccm, preferably, from about 5 sccm to about 50 sccm, and more preferably, from about 10 sccm to about 30 sccm, for example, about 20 sccm. While chlorine is the preferred etchant, other etchants that may be used solely or in combination include chlorine trifluoride ($ClF_3$), tetrachlorosilane ($SiCl_4$), and derivatives thereof.

The silicon source is usually provided into the process chamber in the etching gas for slow etch processes at a rate in a range from about 5 sccm to about 500 sccm, preferably from about 10 sccm to about 100 sccm, and more preferably from about 20 sccm to about 80 sccm, for example, about 50 sccm. Silicon sources that may be used in the etching include silanes, halogenated silanes, organosilanes and derivatives thereof. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X' is independently selected from F, Cl, Br, or I, such as hexachlorodisilane ($Si_2Cl_6$), tetrachlorosilane ($SiCl_4$), dichlorosilane ($Cl_2SiH_2$), and trichlorosilane ($Cl_3SiH$). Organosilanes include compounds with the empirical formula $R_ySi_xH_{(2x+2-y)}$, where R is independently selected from methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), and hexamethyldisilane (($CH_3$)$_6Si_2$). The preferred silicon sources include silane, dichlorosilane, and disilane.

The carrier gas is usually provided into the process chamber in the etching gas at a flow rate in a range from about 1 slm (standard liters per minute) to about 100 slm, preferably, from about 5 slm to about 80 slm, and more preferably, from about 10 slm to about 40 slm, for example, about 20 slm. Carrier gases may include nitrogen ($N_2$), hydrogen ($H_2$), argon, helium, or combinations thereof. An inert carrier gas is preferred and includes nitrogen, argon, helium, or combinations thereof. A carrier gas may be selected based on the precursor(s) used and/or the process temperature during the etching process in step 120.

Preferably, nitrogen is utilized as a carrier gas in embodiments featuring low temperature (e.g., <800° C.) processes. Low temperature processes are accessible due in part to the use of chlorine gas in the etching process. Nitrogen remains inert during low temperature etching processes. Therefore, nitrogen is not incorporated into silicon-containing materials on the substrate during low temperature processes. Also, a nitrogen carrier gas does not form hydrogen-terminated surfaces as does a hydrogen carrier gas. The hydrogen-terminated surfaces formed by the adsorption of hydrogen carrier gas on the substrate surface inhibit the growth rate of subsequently deposited silicon-containing layers. Finally, the low temperature processes may take economic advantage of nitrogen as a carrier gas, since nitrogen is far less expensive than hydrogen, argon or helium. In one example of an etching gas, chlorine is the etchant, silane is the silicon source and nitrogen is the carrier gas.

During step 120, substrate 200 and surface 210 are exposed to an etching gas to remove a predetermined thickness 220 of substrate 200. Surface 210 is also etched during the removal of the predetermined thickness 220. The etching gas is exposed to substrate 200 for a period of time from about 5 seconds to about 5 minutes, preferably from about 30 seconds to about 2 minutes. The amount of time is adjusted relative to the etch rate used in a particular process. The etch rate of a slow etch process is usually less than about 100 Å/min, preferably less than about 50 Å/min. In one embodiment, the slow etch rate is in a range from about 2 Å/min to about 20 Å/min, preferably from about 5 Å/min to about 15 Å/min, for example, about 10 Å/min. In another embodiment, the etch rate is less than about 2 Å/min, preferably less than about 1 Å/min, and more preferably approaches a redistribution of material on the substrate such that the net removal rate is non-measurable relative to the thickness of the layer. As the etch process is slowed to a redistribution reaction, material is removed from the peaks thereon the surface and material is added to troughs thereon the surface. The troughs may be filled by the material derived from the peaks and/or virgin material being produced by the introduction of precursors (e.g., silicon source) in the etching gas.

Surface 210 may have had a surface roughness of about 6 nm root mean square (RMS) or more. However, once the predetermined thickness 220 is removed, the exposed surface 230 is much smoother than surface 210. The exposed surface may have a surface roughness of about 1 nm RMS or less, preferably about 0.1 nm RMS or less and more preferably about 0.07 nm RMS. Contaminants previously disposed on surface 210 are removed. The exposed surface 230 is free or substantially free of contaminants that include organic residues, carbon, oxides, nitrides, halides (e.g., fluorides or chlorides), or combinations thereof.

Once the predetermined thickness 220 and surface 210 of substrate 200 are removed, layer 240 may be deposited during step 130. Preferably, layer 240 is a silicon-containing material that may be selectively and epitaxially deposited on the exposed surface 230 by a chemical vapor deposition (CVD) process. Chemical vapor deposition described herein includes the use of many techniques, such as atomic layer epitaxy (ALE), atomic layer deposition (ALD), plasma-assisted CVD (PA-CVD), atomic layer CVD (ALCVD), organometallic or metalorganic CVD (OMCVD or MOCVD), laser-assisted CVD (LA-CVD), ultraviolet CVD (UV-CVD), hot-wire (HWCVD), reduced-pressure CVD (RP-CVD), ultra-high vacuum CVD (UHV-CVD), and others. In one example, a preferred process is to use thermal CVD to epitaxially grow or deposit a silicon-containing compound as layer 240 on exposed surface 230. The deposition gas used during step 130 may also contain at least one secondary elemental source, such as a germanium source and/or a carbon source. The germanium source may be added to the process chamber with the silicon source, etchant and carrier gas to form a silicon-containing compound. Therefore, the silicon-containing compound may include silicon, SiGe, SiC, SiGeC, doped variants thereof, and combinations thereof. Germanium and/or carbon may be added to the silicon-containing material by including a germanium source (e.g., germane) or a carbon source (e.g., methylsilane) during the deposition process. Dopants may also be included by including a boron source (e.g., diborane), an arsenic source (e.g., arsine), or a phosphorous source (e.g., phosphine) during or after the deposition process.

In another example, a preferred process is to use the CVD process called alternating gas supply (AGS) to epitaxially grow or deposit a silicon-containing compound as layer 240 on exposed surface 230. The AGS deposition process includes a cycle of alternating exposures of silicon-sources and etchants to the substrate surface. An AGS deposition is further disclosed in commonly assigned U.S. Pat. No. 7,312,128, which is incorporated herein by reference in its entirety for the purpose of describing the AGS deposition process.

Process 100 may be used to etch and deposit silicon-containing materials in the same process chamber. Preferably, the slow etch process and the subsequent deposition process are performed in the same process chamber to improve throughput, be more efficient, decrease probability of contamination and benefit process synergies, such as common chemical precursors. In one example, both the slow etch process and the selective, epitaxial deposition process of a silicon-containing compound use chlorine as an etchant and nitrogen as a carrier gas.

Fast Etch

In another embodiment, a fast etch process (e.g., >100 Å/min) is performed to selectively remove silicon-containing material from the substrate surface. The fast etch process is a selective etch process to remove silicon-containing material while leaving barrier material unscathed. Barrier materials may include silicon nitride, silicon oxide, or silicon oxynitride used as spacers, capping layers and mask.

Figure 3:
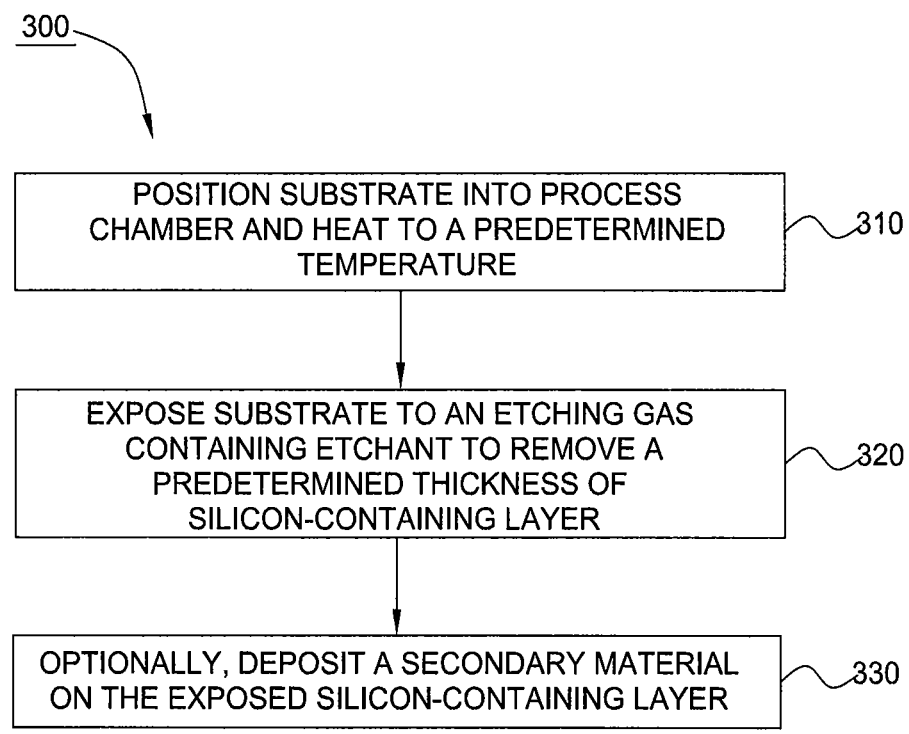
FIG. 3 is a flow chart describing a process to treat silicon-containing materials in another embodiment described herein.

In FIG. 3, process 300 is initiated by positioning the substrate into a process chamber and adjusting the process parameters during step 310. The substrate and/or the process chamber is heated at a temperature in a range from about 400° C. to about 800° C., preferably from about 500° C. to about 700° C. The process chamber is maintained at a pressure in a range from about 1 Torr to about 750 Torr, preferably, from about 100 Torr to about 700 Torr, and more preferably, from about 400 Torr to about 600 Torr.

The etching gas used during the fast etch process in step 320 contains an etchant, a carrier gas and an optional silicon source. Preferably, the etchant is chlorine gas, the carrier gas is nitrogen and the silicon source is silane. The etchant is provided into the process chamber in the etching gas at a rate in a range from about 1 sccm to about 100 sccm, preferably from about 5 sccm to about 50 sccm, and more preferably from about 10 sccm to about 30 sccm, for example, about 20 sccm. While chlorine is the preferred etchant in the fast etch process, other etchants that may be used solely or in combination include chlorine trifluoride ($ClF_3$), tetrachlorosilane ($SiCl_4$), and derivatives thereof.

The carrier gas is usually provided into the process chamber in the etching gas at a flow rate in a range from about 1 slm to about 100 slm, preferably from about 5 slm to about 80 slm, and more preferably from about 10 slm to about 40 slm, for example, about 20 slm. Carrier gases may include nitrogen ($N_2$), hydrogen ($H_2$), argon, helium, or combinations thereof. An inert carrier gas is preferred and includes nitrogen, argon, helium, or combinations thereof. A carrier gas may be selected based on the precursor(s) used and/or the process temperature during the etching process in step 320. Preferably, nitrogen is utilized as a carrier gas in embodiments featuring low temperature (e.g., <800° C.) processes. In one example of an etching gas, chlorine is the etchant and nitrogen is the carrier gas.

In some embodiments, the silicon source is optionally included in the etching gas to provide additional control of the etch rate during fast etch processes. The silicon source is delivered into the process chamber at a rate in a range from about 5 sccm to about 500 sccm, preferably from about 10 sccm to about 100 sccm, and more preferably from about 20 sccm to about 80 sccm, for example, about 50 sccm. Silicon sources that may be used in the etching include silanes, halogenated silanes, organosilanes, and derivatives thereof, as discussed above.

Figure 4A:
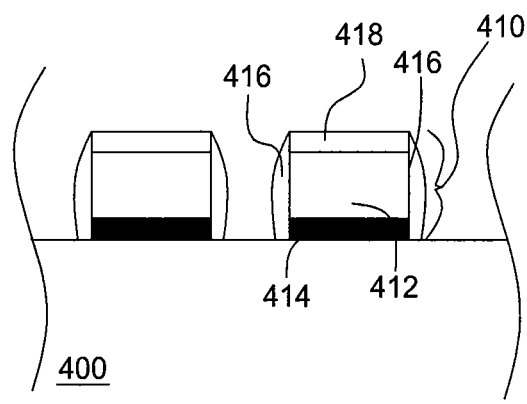
FIGS. 4A-4C show schematic illustrations of layers treated by processes described in FIG. 3.

In FIG. 4A, at least one source/drain feature 410 is disposed on substrate 400. Substrate 400 may be doped or undoped, bare silicon substrate or include a silicon-containing layer disposed thereon. Feature 410 includes gate layer 412 on gate oxide layer 414 surrounded by spacers 416 and protective capping layer 418. Generally, gate layer 412 is composed of a polysilicon. Gate oxide layer 414 is composed of silicon dioxide, silicon oxynitride or hafnium oxide. Partially encompassing the gate oxide layer 414 is a spacer 416, which is usually an isolation material such as a nitride/oxide stack (e.g., $Si_3N_4/SiO_2/Si_3N_4$). Gate layer 412 may optionally have a protective capping layer 418 adhered thereon.

Figure 4B:
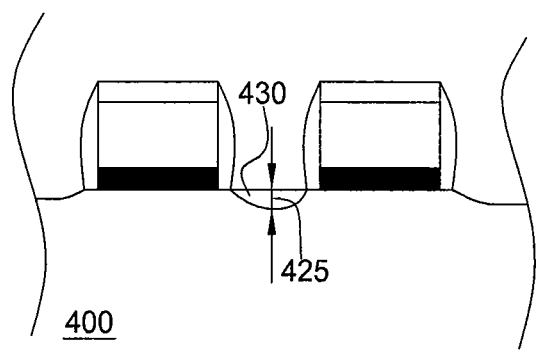
Figure 4C:
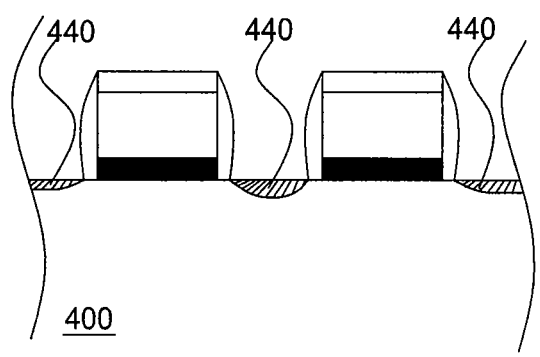

During step 320, substrate 400 is exposed to an etching gas to remove a predetermined thickness 425 of substrate 400 and form a recess 430, as depicted in FIG. 4B. The etching gas is exposed to substrate 400 for a period of time from about 10 seconds to about 5 minutes, preferably from about 1 minute to about 3 minutes. The amount of time is adjusted relative to the etch rate used in a particular process. The etch rate of a fast etch process is usually more than about 100 Å/min, preferably more than about 200 Å/min, such as at rate in a range from about 200 Å/min to about 1,500 Å/min, preferably, from about 200 Å/min to about 1,000 Å/min, for example about 600 Å/min.

In one example, the etching process may be kept at a fast rate to remove the predetermined thickness 425, and then reduced to a slow rate process to smooth the remaining surface. The reduced etching rate may be controlled by an etching process described by process 100.

Once the predetermined thickness 425 of substrate 400 is removed, layer 440 may be deposited during step 330. Preferably, layer 440 is a silicon-containing material that may be selectively and epitaxially deposited on the exposed surface of recess 430 by a CVD process. In one example, the CVD process includes an AGS deposition technique. Alternatively, recess 430 may be exposed to another fabrication process prior to the deposition of layer 440, such as a doping process. One example of a doping process includes ion implantation, in which a dopant (e.g., boron, phosphorous or arsenic) may be implanted into the surface of the recess 430.

Process 300 may be used to etch and deposit silicon-containing materials in the same process chamber. Preferably, the fast etch process and the subsequent deposition is performed in the same process chamber to improve throughput, be more efficient, decrease probability of contamination and benefit process synergies, such as common chemical precursors. In one example, both the fast etch process and the selective, epitaxial deposition process of a silicon-containing compound use chlorine as an etchant and nitrogen as a carrier gas.

Figure 5:
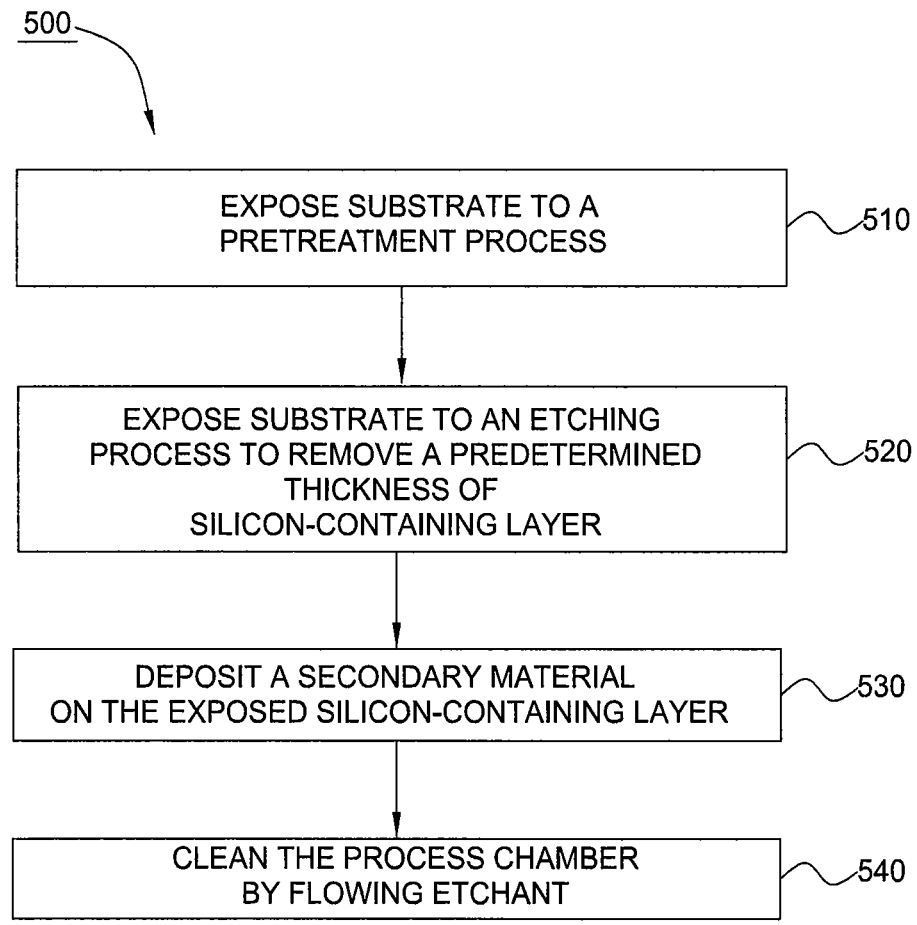
FIG. 5 is a flow chart describing a method to process a substrate and thereafter clean the process chamber by one embodiment described herein.

FIG. 5 illustrates an alternative embodiment of the invention that includes cleaning the process chamber after finishing a fabrication techniques using process 500. During step 510, the substrate is exposed to a pre-treatment process that may include a wet clean process, a HF-last process, a plasma clean, an acid wash process, and combinations thereof. After a pre-treatment process and prior to starting an etching process described herein, the substrate may have to remain outside the controlled environment of the process chamber for a period of time called queue time (Q-time). The Q-time in an ambient environment may last about 2 hours or more, usually, the Q-time last much longer, such as from about 6 hours to about 24 hours or longer, such as about 36 hours. A silicon oxide layer usually forms on the substrate surface during the Q-time due to the substrate being exposed to ambient water and oxygen.

During step 520, the substrate is positioned into a process chamber and exposed to an etching process as described herein. The etching process may be a slow etch process as described in step 120 or a fast etch process as described in step 320. The etching process removes a pre-determined thickness of silicon-containing layer thereon the substrate to form an exposed silicon-containing layer. Thereafter, a secondary material is deposited on the exposed silicon-containing layer during step 530. Usually, the secondary material is in a selective, epitaxially deposited silicon-containing compound. The deposition process may include the processes as described in steps 130 and 330. In one aspect of the embodiment, processes 100 or 300 may each be independently used during steps 520 and 530.

A cleaning process is conducted inside the process chamber to remove various contaminants therein during step 540. Etch processes and/or deposition processes may form or deposit contaminants on surfaces within the process chamber. Usually, the contaminants include silicon-containing materials adhered to the walls and other inner surfaces of the process chamber.

The cleaning process includes heating the process chamber to a temperature in a range from about 600° C. to about 900° C., preferably from about 650° C. to about 800° C. The cleaning process is conducted for a period of time in a range from about 30 seconds to about 3 minutes, preferably, from about 1 minute to about 2 minutes. A cleaning gas contains an etchant and a carrier gas. Preferably, the etchant and the carrier gas are the same gases used during step 520. The etchant is provided into the process chamber within the cleaning gas at a rate in a range from about 10 sccm to about 5,000 sccm, preferably from about 100 sccm to about 3,000 sccm, and more preferably from about 500 sccm to about 2,000 sccm, for example, about 1,000 sccm. Etchants that may be used within the cleaning gas include chlorine, chlorine trifluoride, tetrachlorosilane, and derivatives thereof.

The carrier is usually provided into the process chamber within the cleaning gas at a flow rate in a range from about 1 slm to about 100 slm, preferably from about 5 slm to about 80 slm, and more preferably from about 10 slm to about 40 slm, for example, about 20 slm. Carrier gases may include nitrogen, hydrogen, argon, helium, or combinations thereof. An inert carrier gas is preferred and includes nitrogen, argon, helium, or combinations thereof. Preferably, chlorine is used as an etchant and nitrogen is used as a carrier gas in embodiments of the cleaning processes. A cleaning process that may be used within embodiments of the invention described herein is further disclosed in commonly assigned U.S. Pat. No. 6,042,654, which is incorporated herein by reference in its entirety. The cleaning process may be repeated after processing each individual substrate or after multiple substrates. In one example, the cleaning process is conducted after processing every 25 substrates.

In one example of process 500, the substrate is first exposed to a HF-last process. The substrate is placed into a process chamber and exposed to an etch process that contains chlorine and nitrogen at about 600° C. Within the same process chamber, a silicon-containing layer is epitaxially deposited on the substrate by a deposition process utilizing chlorine and nitrogen at about 625° C. Subsequent the removal of the substrate, the process chamber is heated to about 675° C. and exposed to a cleaning gas containing chlorine and nitrogen.

Embodiments of the etching and depositing processes of silicon-containing compounds described herein may be utilized for fabricating Metal Oxide Semiconductor Field Effect Transistor (MOSFET) and bipolar transistors, such as Bipolar device fabrication (e.g., base, emitter, collector, emitter contact), BiCMOS device fabrication (e.g., base, emitter, collector, emitter contact) and CMOS device fabrication (e.g., channel, source/drain, source/drain extension, elevated source/drain, substrate, strained silicon, silicon on insulator, and contact plug). Other embodiments of processes teach the etching and growing of silicon-containing layers that can be used as gate, base contact, collector contact, emitter contact, elevated source/drain, and other uses.

The processes of the invention can be carried out in equipment known in the art of CVD or ALE. Hardware that can be used to etch and/or deposit silicon-containing films includes the Epi CENTURA® system and the POLYGEN™ system available from Applied Materials, Inc., located in Santa Clara, Calif. A process chamber useful to etch and deposit as described herein is further disclosed in commonly assigned U.S. Pat. No. 6,562,720, which is incorporated herein by reference in its entirety for the purpose of describing the apparatus. Other enabling apparatuses include batch, high-temperature furnaces, as known in the art.

EXAMPLES

The following hypothetical examples were conducted in an Epi CENTURA® system available from Applied Materials, Inc., located in Santa Clara, Calif. The substrates were 300 mm silicon wafers.

Example 1

Pre-clean Process Comparative without Silane

A substrate was exposed to an HF-last process to form a fluoride terminated surface. The substrate was placed in the process chamber and heated to about 600° C. while the atmosphere was maintained at about 20 Torr. The substrate was exposed to an etching gas containing $N_2$ at a flow rate of about 20 slm and $Cl_2$ at flow rate of about 120 sccm. The surface was etched at a rate of about 500 Å/min.

Example 2

Pre-clean Process with Silane

A substrate was exposed to an HF-last process to form a fluoride terminated surface. The substrate was placed in the process chamber and heated to about 600° C. while the atmosphere was maintained at about 20 Torr. The substrate was exposed to an etching gas containing $N_2$ at a flow rate of about 20 slm, $Cl_2$ at flow rate of about 20 sccm and $SiH_4$ at a flow rate of about 50 sccm. The surface was etched at a rate of about 10 Å/min. Therefore, the addition of a silicon source, such as silane in Example 2, reduced the etch rate of the silicon-containing layer by about 50 times as compared to the etch rate in Example 1.

Example 3

Smoothing Process Comparative Without Silane

A substrate surface containing a silicon-containing layer was cleaved forming a surface with a roughness of about 5.5 nm root mean square (RMS). The substrate was placed in the process chamber and heated to about 650° C. while the atmosphere was maintained at about 200 Torr. The substrate was exposed to an etching gas containing $N_2$ at a flow rate of about 20 slm and $Cl_2$ at flow rate of about 20 sccm. The surface was etched at a rate of about 200 Å/min.

Example 4

Smoothing Process with Silane

A substrate surface containing a silicon-containing layer was cleaved forming a surface with a roughness of about 5.5 nm root mean square. The substrate was placed in the process chamber and heated to about 650° C. while the atmosphere was maintained at about 200 Torr. The substrate was exposed to an etching gas containing $N_2$ at a flow rate of about 20 slm, $Cl_2$ at flow rate of about 20 sccm and $SiH_4$ at a flow rate of about 50 sccm. The surface was etched at a rate of about 20 Å/min. The surface roughness was reduced to about 0.1 nm RMS. Therefore, the addition of a silicon source, such as silane used in Example 4, reduced the etch rate of the silicon-containing layer by about 10 times as compared to the etch rate in Example 3.

Example 5

Chlorine Etch Process Followed by Silicon-epitaxy

A silicon substrate contained a series of silicon nitride line features that are about 90 nm tall, about 100 nm wide and about 150 nm apart, baring the silicon surface. The substrate was placed in the process chamber and heated to about 600° C. while the atmosphere was maintained at about 40 Torr. The substrate was exposed to an etching gas containing $N_2$ at a flow rate of about 20 slm and $Cl_2$ at flow rate of about 80 sccm. The surface was etched at a rate of about 750 Å/min. After about 30 seconds, about 35 nm of the silicon surface was etched. The silicon nitride features remain inert to the etching process. The pressure was increased to about 200 Torr and $SiH_4$ was added to the etching gas at a flow rate of about 50 sccm. The etch rate was reduced to about 18 Å/min to smooth the freshly etched silicon surface. After about 1 minute, the smooth surface is exposed to a selective epitaxy deposition process by increasing the flow of $SiH_4$ to about 100 sccm and maintaining the flow of $N_2$ and $Cl_2$ unchanged. A silicon-containing material was deposited on the silicon surface at a rate of about 25 Å/min.

Example 6

Chlorine Fast Etch Process Containing Silane

A silicon substrate contained a series of silicon nitride line features that are about 90 nm tall, about 100 nm wide and about 150 nm apart, baring the silicon surface. The substrate was placed in the process chamber and heated to about 600° C. while the atmosphere was maintained at about 40 Torr. The substrate was exposed to an etching gas containing $N_2$ at a flow rate of about 20 slm, $Cl_2$ at flow rate of about 80 sccm and $SiH_4$ at flow rate of about 40 sccm. The surface was etched at a rate of about 400 Å/min.

While the foregoing is directed to embodiments of the invention, other and further embodiments of the invention may be devised without departing from the basic scope thereof, and the scope thereof is determined by the claims that follow.

The invention claimed is:

1. A method for etching and depositing silicon materials on a substrate surface, comprising:
   heating a substrate comprising a silicon-containing material to a temperature of about 800° C. or less within a process chamber, wherein a contaminant is disposed on the silicon-containing material;
   removing the contaminant and a portion of the silicon-containing material to reveal an exposed surface of the silicon-containing material during an etching process, wherein the etching process comprises exposing the contaminant and the silicon-containing material to an etching gas comprising chlorine gas ($Cl_2$) and a silicon source gas within the process chamber and the silicon-containing material is removed at a rate within a range from about 2 Å per minute to about 20 Å per minute during the etching process; and
   depositing a silicon-containing layer on the exposed surface of the silicon-containing material during a deposition process by flowing the chlorine gas and the silicon source gas to the exposed surface within the process chamber, wherein the deposition process is an alternating gas supply process further comprising providing alternating exposures of the chlorine gas and the silicon source gas to the exposed surface while epitaxially growing the silicon-containing layer on the exposed surface.

2. The method of claim 1, wherein the temperature of the substrate is within a range from about 400° C. to about 800° C. during the etching process.

3. The method of claim 2, wherein the temperature of the substrate is within a range from about 500° C. to about 700° C. during the etching process.

4. The method of claim 1, wherein the silicon-containing material is removed at a rate within a range from about 5 Å per minute to about 15 Å per minute during the etching process.

5. The method of claim 1, wherein the etching gas further comprises a carrier gas selected from the group consisting of nitrogen, argon, helium, and combinations thereof.

6. The method of claim 5, wherein the silicon source gas comprises a silicon source selected from the group consisting of silane, disilane, trisilane, methylsilane, derivatives thereof, and combinations thereof.

7. The method of claim 6, wherein the carrier gas is nitrogen and the silicon source is silane.

8. The method of claim 1, wherein the contaminant comprises a species selected from the group consisting of oxide, fluoride, chloride, nitride, organic residue, carbon, derivatives thereof, and combinations thereof.

9. The method of claim 8, wherein the substrate is exposed to a wet clean process prior to heating the substrate within the process chamber.

10. The method of claim 9, wherein the substrate is exposed to ambient conditions for a time period within a range from about 6 hours to about 24 hours subsequent the wet clean process and prior to heating the substrate within the process chamber.

11. The method of claim 1, wherein the silicon-containing material comprises a surface roughness of 1 nm RMS or greater prior to the etching process and a surface roughness of less than 1 nm RMS subsequent to the etching process.

12. A method for etching and depositing silicon materials on a substrate surface, comprising:
    heating a substrate comprising a silicon-containing material to a temperature of about 800° C. or less within a process chamber, wherein an upper surface of the silicon-containing material has a surface roughness of 1 nm RMS or greater;
    forming an exposed surface on the silicon-containing material by smoothing the upper surface of the silicon-containing material during a smoothing process, wherein the exposed surface has a surface roughness of less than 1 nm RMS and the smoothing process comprises exposing the upper surface of the silicon-containing material to an etching gas comprising chlorine gas ($Cl_2$) and a silicon source gas within the process chamber; and
    depositing a silicon-containing layer on the exposed surface of the silicon-containing material during a deposition process by flowing the chlorine gas and the silicon source gas to the exposed surface within the process chamber, wherein the deposition process is an alternating gas supply process further comprising providing alternating exposures of the chlorine gas and the silicon source gas to the exposed surface while epitaxially growing the silicon-containing layer on the exposed surface.

13. The method of claim 12, wherein the surface roughness of the exposed surface is about 0.1 nm RMS or less.

14. The method of claim 13, wherein the surface roughness of the exposed surface is about 0.07 nm RMS or less.

15. The method of claim 12, wherein the temperature of the substrate is within a range from about 500° C. to about 700° C. during the etching process.

16. The method of claim 12, wherein the etching gas further comprises a carrier gas selected from the group consisting of nitrogen, argon, helium, and combinations thereof.

17. The method of claim 16, wherein the silicon source gas comprises a silicon source selected from the group consisting of silane, disilane, trisilane, methylsilane, derivatives thereof, and combinations thereof.

18. A method for etching and depositing silicon materials on a substrate surface, comprising:
    exposing a substrate comprising a monocrystalline silicon material to a HF-last wet clean solution during a preclean process;
    transferring the substrate to a processing chamber subsequent the preclean process;
    heating the substrate a temperature of about 800° C. or less within the process chamber;
    forming an exposed monocrystalline surface on the monocrystalline silicon material by removing a portion of the monocrystalline silicon material during an etching process, wherein the etching process comprises exposing the monocrystalline silicon material to an etching gas comprising chlorine gas ($Cl_2$) and a silicon source gas within the process chamber and the monocrystalline silicon material is removed at a rate within a range from about 2 Å per minute to about 20 Å per minute during the etching process; and
    depositing a silicon-containing layer on the exposed monocrystalline surface of the monocrystalline silicon material within the process chamber during a deposition process by exposing the exposed monocrystalline surface to the chlorine gas and the silicon source gas, wherein the deposition process is an alternating gas supply process further comprising providing alternating exposures of the chlorine gas and the silicon source gas to the exposed monocrystalline surface while epitaxially growing the silicon-containing layer on the exposed monocrystalline surface.

* * * * *